(12) United States Patent
Cheng et al.

(10) Patent No.: US 11,404,386 B2
(45) Date of Patent: Aug. 2, 2022

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Po-Jen Cheng, Kaohsiung (TW); Po-Hsiang Wang, Kaohsiung (TW); Fu-Yuan Chen, Kaohsiung (TW); Wei-Jen Wang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/006,672

(22) Filed: Aug. 28, 2020

(65) Prior Publication Data

US 2022/0068840 A1 Mar. 3, 2022

(51) Int. Cl.

| | |
|---|---|
| *H01L 23/58* | (2006.01) |
| *H01L 23/00* | (2006.01) |
| *H01L 23/538* | (2006.01) |
| *H01L 21/683* | (2006.01) |
| *H01L 21/48* | (2006.01) |

(Continued)

(52) U.S. Cl.
CPC ........ *H01L 23/562* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01);

(Continued)

(58) Field of Classification Search
CPC . H01L 23/562; H01L 21/568; H01L 21/6835; H01L 23/5386; H01L 21/565; H01L 24/20; H01L 24/19; H01L 21/4857; H01L 23/5389; H01L 23/3128; H01L 21/4853; H01L 23/5383; H01L 2924/3511; H01L 2224/214; H01L 2221/68372
USPC ........................................................ 257/668
See application file for complete search history.

(56) References Cited

U.S. PATENT DOCUMENTS

| | | | | |
|---|---|---|---|---|
| 8,409,979 B2 * | 4/2013 | Choi | ....................... | H01L 24/11 438/613 |
| 8,853,558 B2 * | 10/2014 | Gupta | ..................... | H01L 24/14 174/260 |

(Continued)

FOREIGN PATENT DOCUMENTS

CN 106229270 A 12/2016

*Primary Examiner* — Vu A Vu

(74) *Attorney, Agent, or Firm* — Foley & Lardner LLP

(57) ABSTRACT

A semiconductor device package and manufacturing method thereof are provided. The semiconductor device package includes a first conductive structure, a second conductive structure, a connection element, a conductive member, an encapsulant and a binding layer. The first conductive structure includes a first circuit layer. The second conductive structure is disposed over the first conductive structure. The connection element is disposed on and electrically connected to the first circuit layer. The conductive member protrudes from the second conductive structure. The encapsulant is disposed between the first conductive structure and the second conductive structure. The binding layer is disposed between the second conductive structure and the encapsulant.

9 Claims, 13 Drawing Sheets

(51) Int. Cl.
  *H01L 21/56* (2006.01)
  *H01L 23/31* (2006.01)
(52) U.S. Cl.
  CPC ........... *H01L 2221/68372* (2013.01); *H01L 2224/214* (2013.01); *H01L 2924/3511* (2013.01)

(56) References Cited

U.S. PATENT DOCUMENTS 10,049,964 B2 * 8/2018 Shim ................ H01L 24/97
2019/0096791 A1 * 3/2019 Jeng ................ H01L 22/14

* cited by examiner

SEMICONDUCTOR DEVICE PACKAGE AND METHOD OF MANUFACTURING THE SAME

TECHNICAL FIELD

The present disclosure generally relates to a semiconductor device package and method of manufacturing the same, and more particularly relates to a semiconductor device package including a binding layer interposed two conductive structures and method of manufacturing the same.

BACKGROUND

A three-dimensional (3D) semiconductor device package such as a package on package (POP) may be subject to warpage due to its asymmetrical structure, empty gap between the stacked structures and characteristic mismatch between structural layers. The thermal cycles of high temperature operation(s) such as a reflow operation and a baking operation and low temperature operation(s) such as a clean operation during a manufacturing process may result in relatively greater warpage of the semiconductor device package. In addition, the overall thickness of 3D semiconductor device package needs to be reduced to fulfill miniaturization requirement for electronic products. Therefore, there is a desire for, for example, but not limited to, a semiconductor device package that would alleviate or avoid the problem mentioned above.

SUMMARY

One aspect of the present disclosure relates to a semiconductor device package including a first conductive structure, a second conductive structure, a connection element, a conductive member, an encapsulant and a binding layer. The first conductive structure includes a first circuit layer. The second conductive structure is disposed over the first conductive structure. The connection element is disposed on and electrically connected to the first circuit layer. The conductive member protrudes from the second conductive structure. The encapsulant is disposed between the first conductive structure and the second conductive structure. The binding layer is disposed between the second conductive structure and the encapsulant.

Another aspect of the present disclosure relates to a method of manufacturing a semiconductor device package including the following operations. A first conductive structure including a first circuit layer is provided, and a connection element is provided on the first conductive structure electrically connected to the first circuit layer. An encapsulant is formed on the first conductive structure covering the connection element. The encapsulant and the connection element are truncated. A second conductive structure with a conductive member is provided, and the second conductive structure is disposed on the encapsulant and the connection element. The second conductive structure is bonded to the first conductive structure with a binding layer being interposed between the second conductive structure and the encapsulant and with the conductive member penetrating through the binding layer.

BRIEF DESCRIPTION OF THE DRAWINGS

Aspects of the present disclosure are best understood from the following detailed description when read with the accompanying figures. It is noted that various features may not be drawn to scale, and the dimensions of the various features may be arbitrarily increased or reduced for clarity of discussion.

DETAILED DESCRIPTION

Figure 1:
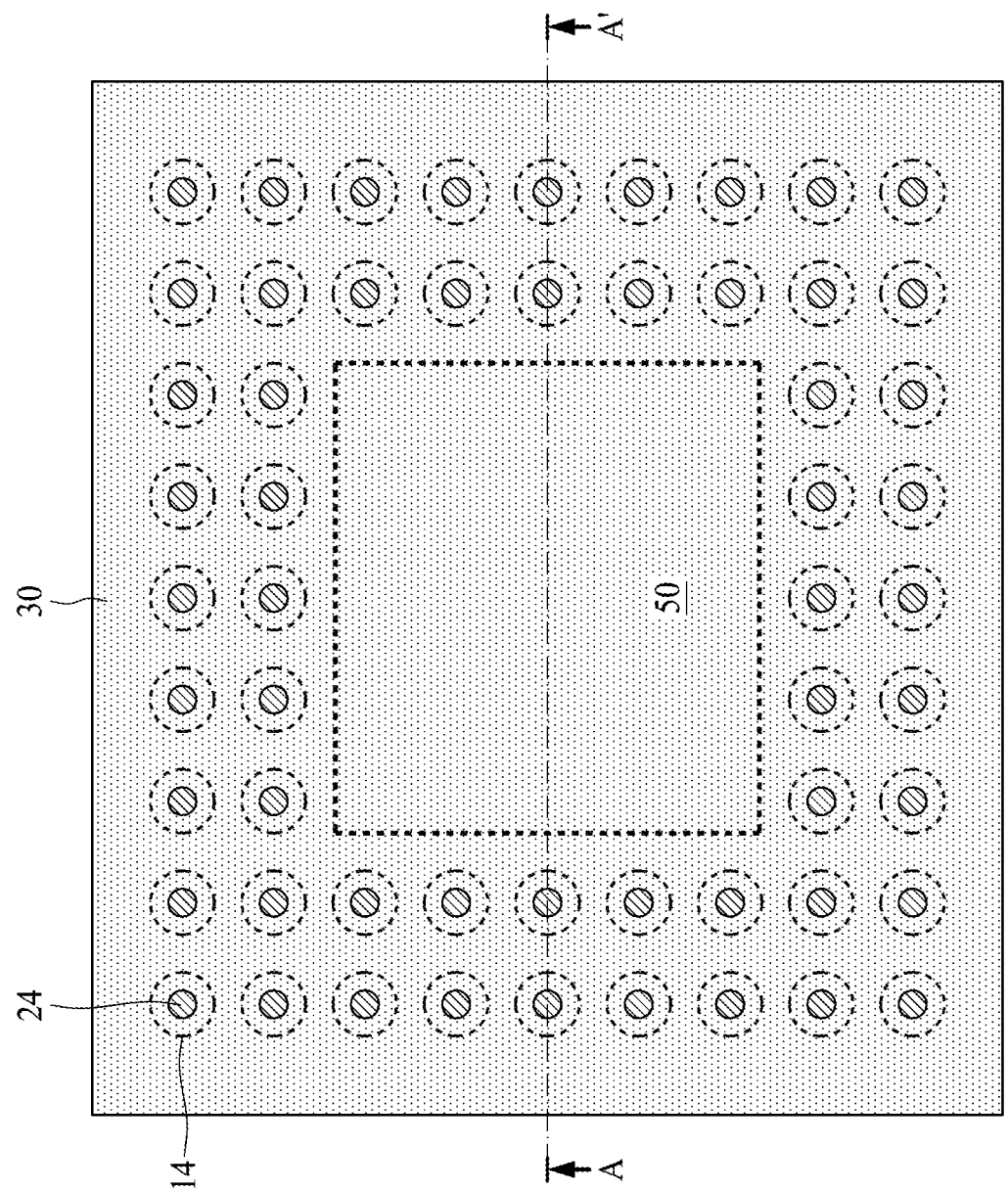
FIG. 1 is a schematic top view of a semiconductor device package structure in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

Some embodiments, or examples, illustrated in the figures are disclosed below using specific language. It will nevertheless be understood that the embodiments and examples are not intended to be limiting. Any alterations and modifications of some of the disclosed embodiments, and any further applications of the principles disclosed in this document, as would normally occur to one of ordinary skill in the pertinent art, fall within the scope of this disclosure.

Further, it is understood that several processing steps (e.g., operations) and/or features of a device may be briefly described. Also, additional processing steps and/or features can be added, and certain of the processing steps and/or features described herein can be removed or changed while implementing the methods described herein or while using the systems and devices described herein. Thus, the following description should be understood to represent examples, and are not intended to suggest that one or more steps or features are required for every implementation. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Figure 1A:
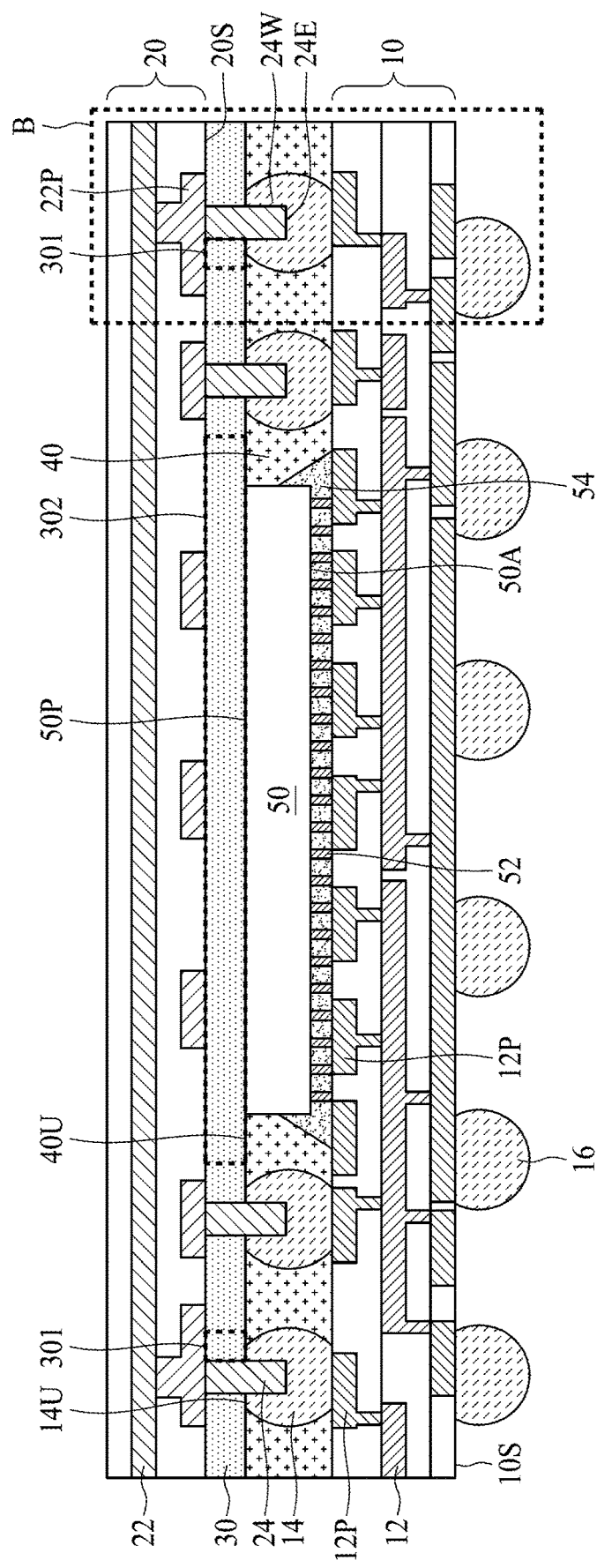
FIG. 1A is a schematic cross-sectional view of a semiconductor device package structure along a line A-A' in accordance with some embodiments of the present disclosure.
Figure 1B:
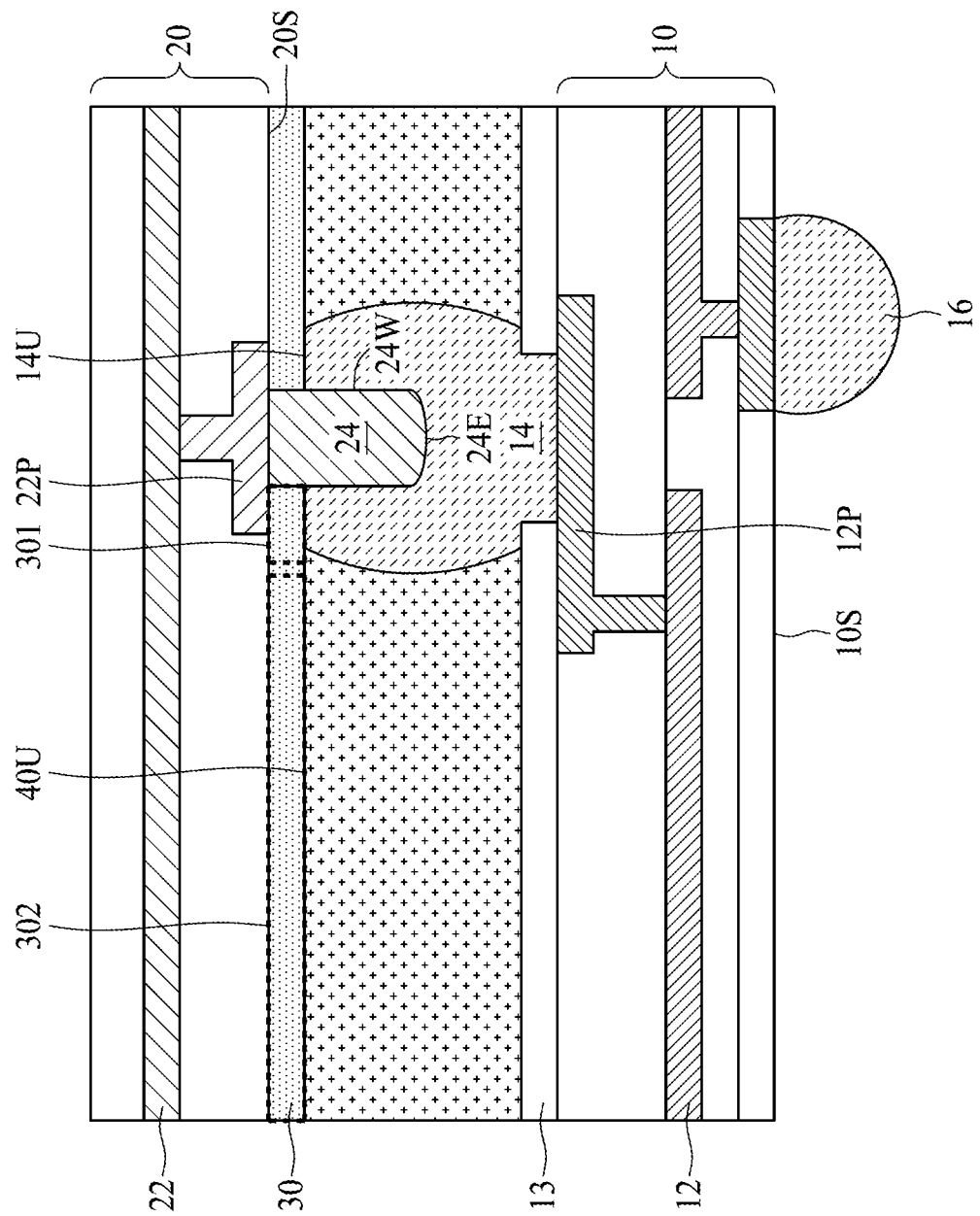
FIG. 1B is a partial enlarged view of a region "B" of a semiconductor device package structure in FIG. 1A.

FIG. 1 is a schematic top view of a semiconductor device package structure 1 in accordance with some embodiments of the present disclosure, FIG. 1A is a schematic cross-sectional view of a semiconductor device package structure 1 along a line A-A' in accordance with some embodiments of the present disclosure, and FIG. 1B is a partial enlarged view of a region "B" of a semiconductor device package structure 1 in FIG. 1A. It is contemplated that some of the components such as a second conductive structure is omitted in FIG. 1 to highlight features of the semiconductor device package 1. As shown in FIG. 1, FIG. 1A and FIG. 1B, the semiconductor device package 1 includes a first conductive structure 10, a second conductive structure 20, a connection element 14, a conductive member 24, an encapsulant 40 and a binding layer 30. The first conductive structure10 may include a first circuit layer 12. In some embodiments, the first circuit layer 12 may include bonding pads 12P. The first circuit layer 12 may include, but is not limited to be, a bumping-level circuit layer. By way of example, the line width/ spacing (L/S) of the first circuit layer 12 may be lower than about 10 μm/about 10 μm such as between about 2 μm/about 2 μm and about 5 μm/about 5 μm or even lower than about 2 μm/about 2 μm. The bumping-level circuit layer may be patterned and defined by e.g., photolithography-plating-etching technique. In some embodiments, the first circuit layer 12 may include one or more conductive layers and one or more insulative layer(s) alternately stacked. The material of the conductive layer(s) may include, but is not limited to, metal such as copper. The material of the insulative layer(s) may include organic insulative material such as epoxy resin, bismaleimide-triazine (BT) resin, inorganic insulative material such as silicon oxide, silicon nitride, or a combination thereof. In some embodiments, the first conductive structure 10 may further include a passivation layer 13 (shown in FIG. 1B) covering the first circuit layer 12, and exposing the conductive pads 12P.

The second conductive structure 20 is disposed over the first conductive structure10. The second conductive structure 20 may include a second circuit layer 22, and the second circuit layer 22 may include one or more conductive pads 22P. The L/S of the second circuit layer 22 may, but is not limited to, be different from that of the first circuit layer 12. By way of example, the second conductive structure 20 may include, but is not limited to be, a semiconductor interposer such as a silicon interposer having an L/S finer than that of the first circuit layer 12. The semiconductor interposer may be formed by advanced photolithography and etching technique, and the L/S of the second circuit layer 22 of the semiconductor interposer may be lower than about 2 μm/about 2 μm. The second circuit layer 22 may also include a redistribution layer (RDL) or other types of circuit layer. In some embodiments, other electronic components such as another semiconductor die or another package may be stacked on the second conductive structure 20, and electrically connected to the first conductive structure 10 and the semiconductor die 50 through the second conductive structure 20.

The connection element 14 is disposed on the first circuit layer 12, and electrically connected to the first circuit layer 12. For example, the connection element 14 may be electrically connected to one of the bonding pads 12P. In some embodiments, the connection element 14 may include a solder material such as tin (Sn), lead (Pb), gold (Au), copper (Cu) or an alloy thereof. In some embodiments, flux agent may be added in the solder material. The connection element 14 may include a solder ball, a solder bump or the like.

The conductive member 24 protrudes from a surface 20S of the second conductive structure 20. The conductive member 24 is electrically connected to the connection element 14. The conductive member 24 may include a non-solder material. For example, the conductive member 24 may include a metal material such as a copper material. The conductive member 24 may include a pillar or stud such as a copper pillar or copper stud, which partially inserts into the connection element 14. The sidewall 24W and the end 24E of the conductive member 24 may be covered by the connection element 14. In some embodiments, the conductive member 24 is connected to and protruded out from the conductive pad 22P of the second circuit layer 22. The width of the conductive member 24 may be narrower than the conductive pad 22P, and thus the conductive pad 22P may be partially exposed from the conductive member 24.

The encapsulant 40 is disposed between the first conductive structure 10 and the second conductive structure 20, and may laterally surround the connection element 14. The material of the encapsulant 40 may include molding compound such as epoxy-based material (e.g. FR4), resin-based material (e.g. Bismaleimide-Triazine (BT)), Polypropylene (PP)) or other suitable materials. The encapsulation 40 may further include fillers such as silicon oxide fillers dispensed in the molding compound. In some embodiments, the encapsulant 40 and the connection element 14 may be truncated by e.g., grinding such that an upper surface 40U of the encapsulant 40 and an upper surface 14U of the connection element 14 are substantially coplanar.

The electrical connection between the first conductive structure 10 and the second conductive structure 20 is achieved by a combination of the connection element 14 (e.g., solder ball) and the conductive member 24 (e.g., copper stud) rather than the solder ball alone. Compared to the solder ball alone, the combination of the solder ball and the copper stud can reduce the pitch of adjacent electrical terminals, for example from about 0.27 mm to about 0.2 mm, and thus more I/O terminals can be formed within the same area.

The binding layer 30 is disposed between the second conductive structure 20 and the encapsulant 40. In some embodiments, the material of the binding layer 30 may include insulative material. By way of example, polymeric material such as epoxy resin or the like, gel and glue may be selected. In some embodiments, flux agent may be added. The binding layer 30 may include a non-conductive film (NCF) or a non-conductive paste (NCP). In some other embodiments, the binding layer 30 may include an underfill (UF). The conductive member 24 penetrates through the binding layer 30, and electrically connects the connection element 14. In some embodiments, a first portion 301 of the binding layer 30 may be disposed between the second conductive structure 20 and the connection element 14. The first portion 301 of the binding layer 30 may, but is not limited to, be in contact with the connection element 14 and/or the conductive member 24. The first portion 301 of the binding layer 30 may also be in contact with the second conductive structure 20. For example, the first portion 301 of the binding layer 30 may be in contact with the conductive pad 22P of the second circuit layer 22.

The semiconductor device package 1 may further include a semiconductor die 50 disposed between the first conductive structure 10 and the second conductive structure 20. In some embodiments, the semiconductor die 50 includes an active surface 50A facing and electrically connected to bonding pads 12P of the first circuit layer 12, and an inactive surface 50P facing the second conductive structure 20. The semiconductor die 50 may include conductive features 52 such as copper pillars, solder pastes or a combination thereof. In some embodiments, an underfill (UF) 54 may be disposed between the semiconductor die 50 and the first conductive structure 10. In some embodiments, electrical conductors 16 such as solder balls are disposed on a back side 10S of the first conductive structure 10 and configured to electrically connect the first conductive structure 10 to an external electronic device such as a printed circuit board (PCB).

In some embodiments, the semiconductor device package 1 may include a plurality pairs of connection element 14 and conductive member 24, and the pairs of connection element 14 and conductive member 24 can be arranged on one side, two sides, three sides or four sides of the semiconductor die 50.

In some embodiments, a second portion 302 of the binding layer 30 is disposed between the second conductive structure 20 and the inactive surface 50P of the semiconductor die 50, and the second portion 302 of the binding layer 30 may be in contact with inactive surface 50P of the semiconductor die 50, the encapsulant 40 and/or the second conductive structure 20. The encapsulant 40 may be truncated by e.g., grinding to reduce the thickness of the encapsulant 40. After truncating, the inactive surface 50P of the semiconductor die 50 is exposed and substantially coplanar with the upper surface 40U of the encapsulant 40 and the upper surface 14U of the connection element 14. The inactive surface 50P, the upper surface 40U of the encapsulant 40 and the upper surface 14U of the connection element 14 after being truncated (e.g., grinded) collectively form a substantially flat surface, which provide a better landing and adhesion for the binding layer 30 and the second conductive structure 20. In some embodiments, the binding layer 30 may be in contact with the inactive surface 50P of the semiconductor die 50 exposed from the encapsulant 40.

As shown in FIG. 1, FIG. 1A and FIG. 1B, the encapsulant 40 and the binding layer 30 fill the gap between the first conductive structure 10 and the second conductive structure 20, and the gap between the semiconductor die 50 and the second conductive structure 20, and thus there is substantially no empty gap therebetween. The first portion 301 and the second portion 302 of the binding layer 30 contacts most of the surface of the encapsulant 40, and can provide a stress upon throughout the encapsulant 40 and the first conductive structure 10. Accordingly, warpage of the semiconductor device package 1 can be alleviated. By way of example, the warpage can be reduced to less than about 100 micrometers, or even less than about 80 micrometers. By virtue of the binding layer 30, the encapsulant 40 can be grinded and thus the overall thickness of the semiconductor device package 1 can be reduced. By way of example, the overall thickness of the semiconductor device package 1 can be reduced from about 650 micrometers to be lower than about 400 micrometers such as about 390 micrometers.

The semiconductor device packages and manufacturing methods of the present disclosure are not limited to the above-described embodiments, and may be implemented according to other embodiments. To streamline the description and for the convenience of comparison between various embodiments of the present disclosure, similar components of the following embodiments are marked with same numerals, and may not be redundantly described.

Figure 2A:
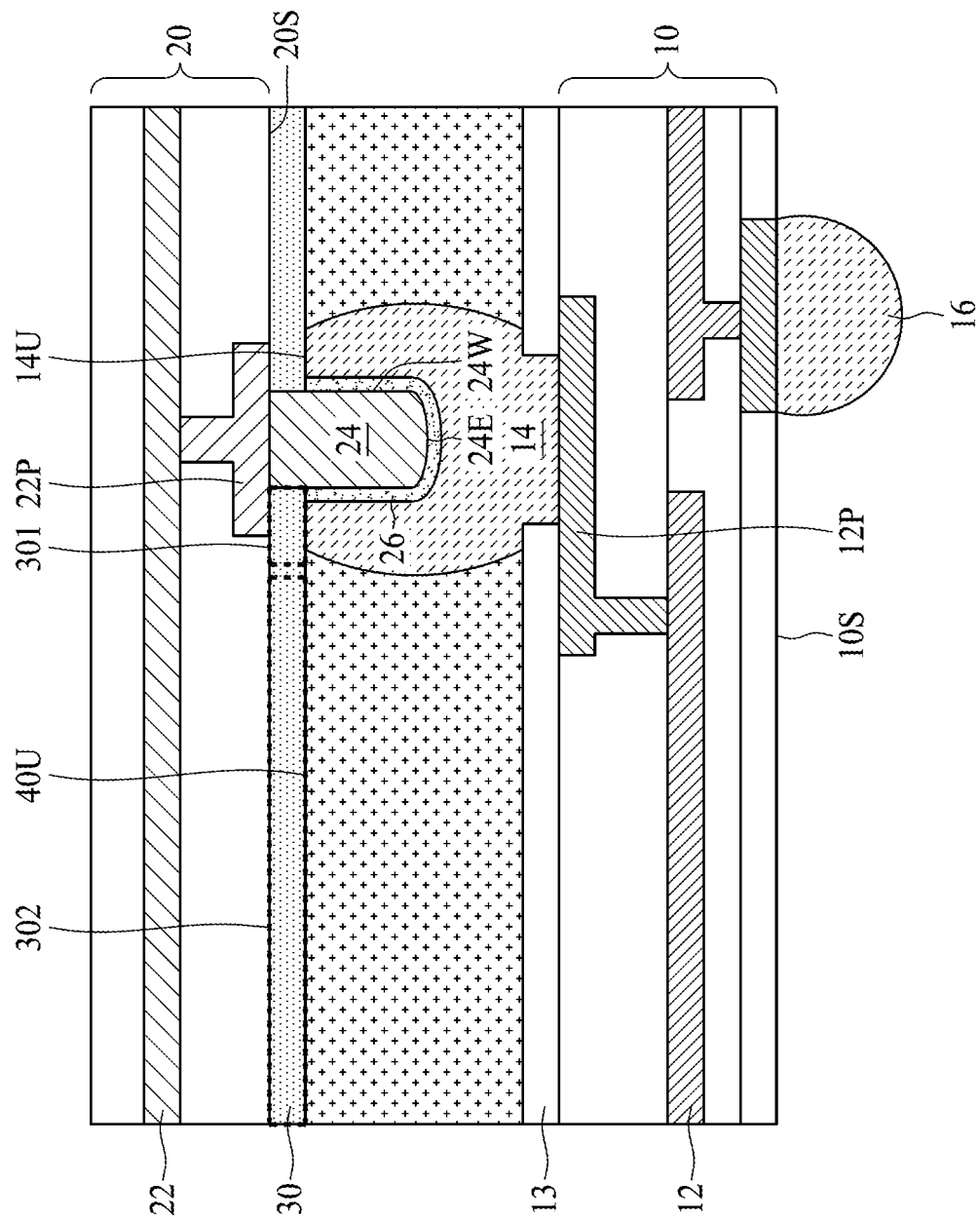
FIG. 2A is an enlarged view of a semiconductor device package in accordance with some variation embodiments of the present disclosure.

FIG. 2A is an enlarged view of a semiconductor device package 2A in accordance with some variation embodiments of the present disclosure. As shown in FIG. 2A, in contrast to the semiconductor device package 1 of FIG. 1, FIG. 1A and FIG. 1B, the semiconductor device package 2A further includes an interfacial layer 26. In some embodiments, the interfacial layer 26 may include an intermetallic compound (IMC) of the materials of the connection element 14 and the conductive member 24. By way of example, the interfacial layer 26 may include Cu—Sn IMC. In some embodiments, the interfacial layer 26 may be disposed between the end 24E of the conductive member 24 and the connection element 14. The interfacial layer 26 may be disposed between the sidewall 24W of the conductive member 24 and the connection element 14. In some embodiments, the interfacial layer 26 may be in contact with the first portion 301 of the binding layer 30. In some embodiments, entrapment such as residues of the binding layer 30 may exist in the interfacial layer 26.

Figure 2B:
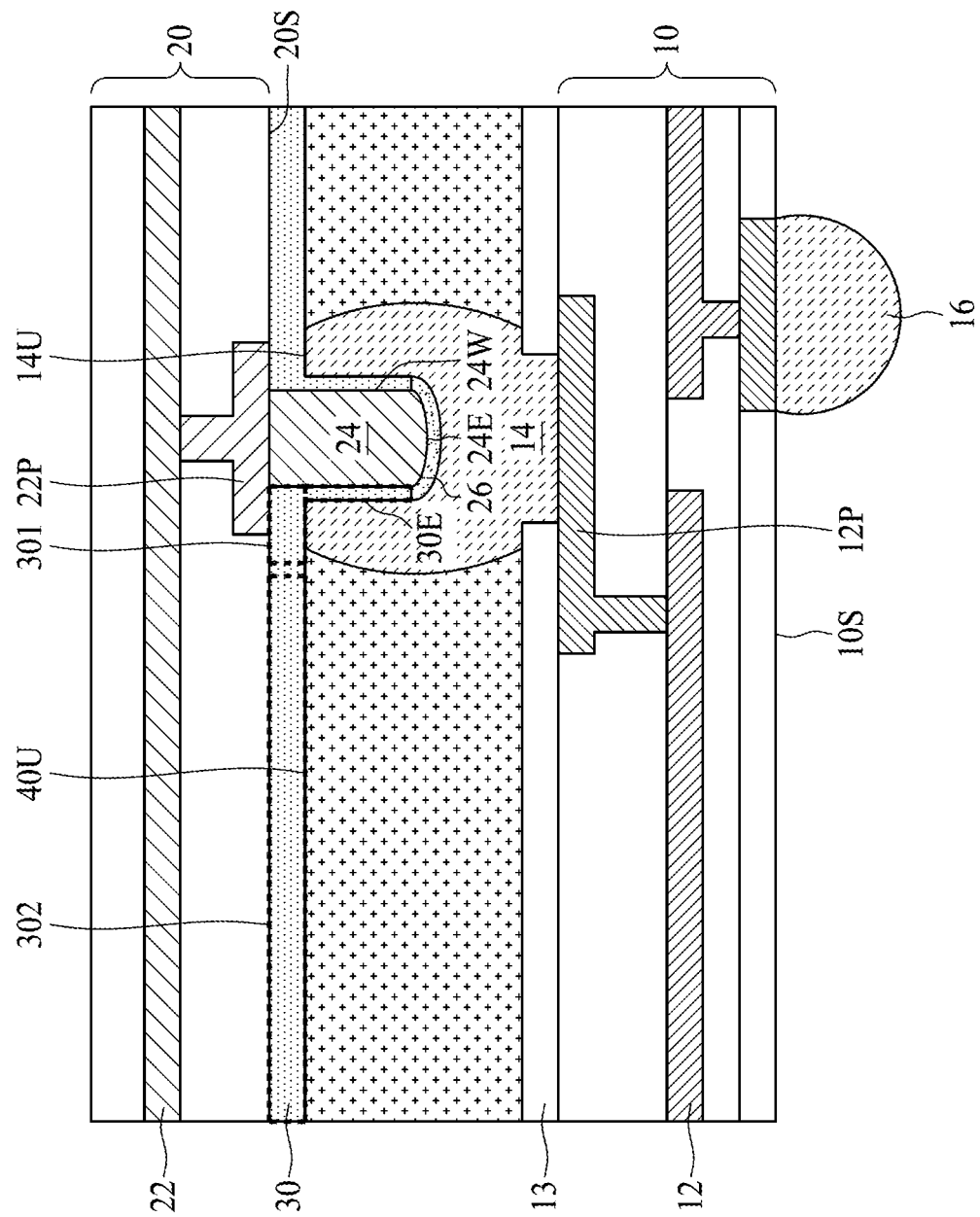
FIG. 2B is an enlarged view of a semiconductor device package in accordance with some variation embodiments of the present disclosure.

FIG. 2B is an enlarged view of a semiconductor device package 2B in accordance with some variation embodiments of the present disclosure. As shown in FIG. 2B, in contrast to the semiconductor device package 2A of FIG. 2A, the interfacial layer 26 may be disposed between the end 24E of the conductive member 24 and the connection element 14. The binding layer 30 may further include an extending portion 30E extending toward the first conductive structure 10 and disposed between the sidewall 24W of the conductive member 24 and the connection element 14. The extending portion 30E may be in contact with the conductive member 24 and/or the connection element 14.

Figure 3A:
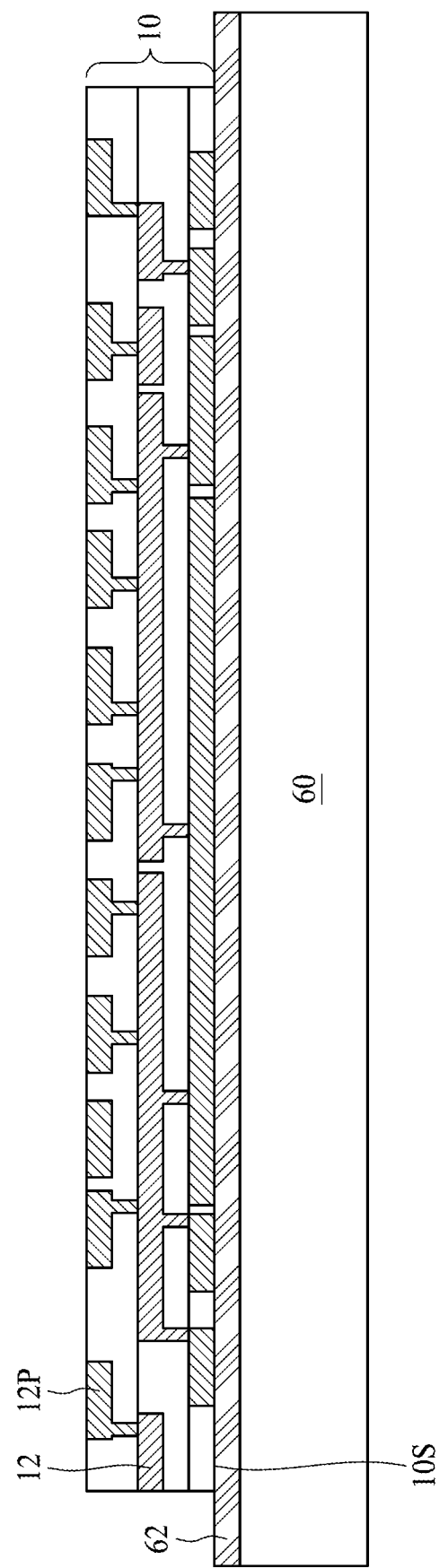
FIG. 3A, FIG. 3B, FIG. 3C, FIG. 3D, FIG. 3E and FIG. 3F illustrate operations of manufacturing a semiconductor device package in accordance with some embodiments of the present disclosure.
Figure 3B:
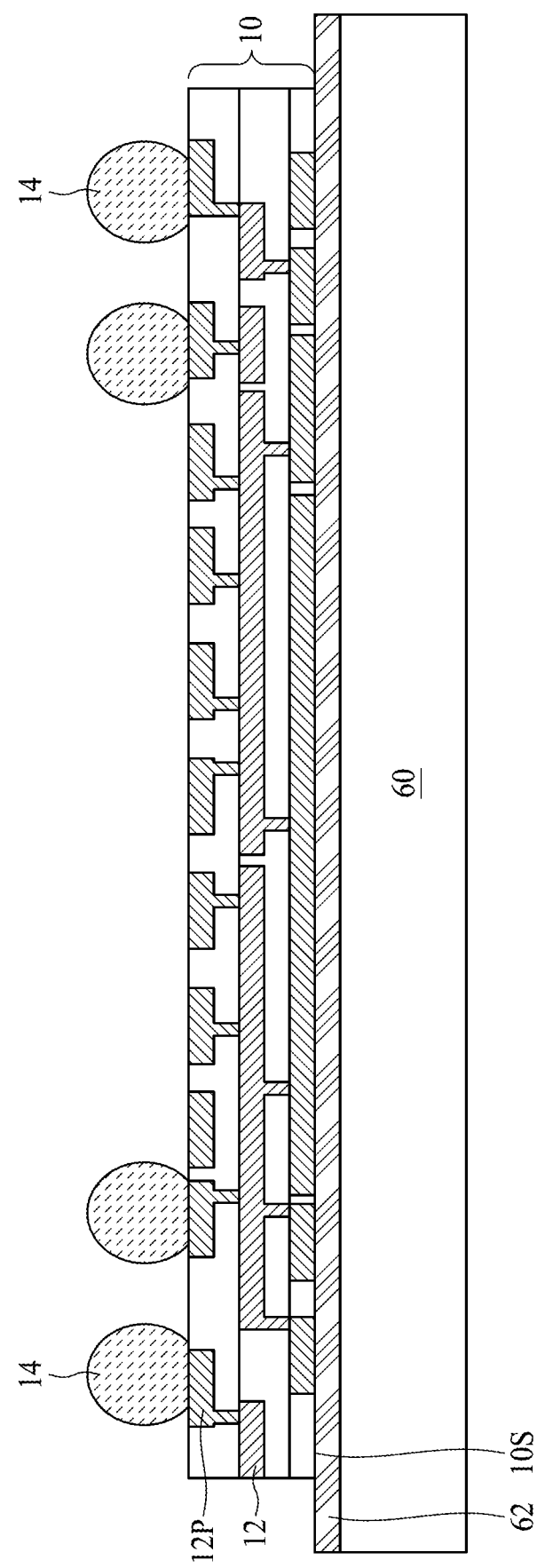

FIG. 3A, FIG. 3B, FIG. 3C, FIG. 3D, FIG. 3E and FIG. 3F illustrate operations of manufacturing a semiconductor device package in accordance with some embodiments of the present disclosure. As shown in FIG. 3A, a first conductive structure 10 is formed on a carrier 60. The carrier 60 is used as a temporary support, and may be removed later. In some embodiments, the carrier may include an epoxy-based substrate such as an FR4 substrate or the like. In some embodiments, a seed layer 62 such as a copper layer may be formed. Subsequently, a first circuit layer 12 may be formed on the seed layer 62 by, for example electroplating one or more conductive layers. In some embodiments, an organic solderability preservative (OSP) treatment can be performed on bonding pads 12P of the first circuit layer 12. As shown in FIG. 3B, connection elements 14 are formed on the first conductive structure and electrically connected to at least some of the bonding pads 12P of the first circuit layer 12. In some embodiments, the connection elements 14 may be formed by dispensing solder material on the bonding pads 12P, and a reflow operation may be formed to form solder balls.

Figure 3C:
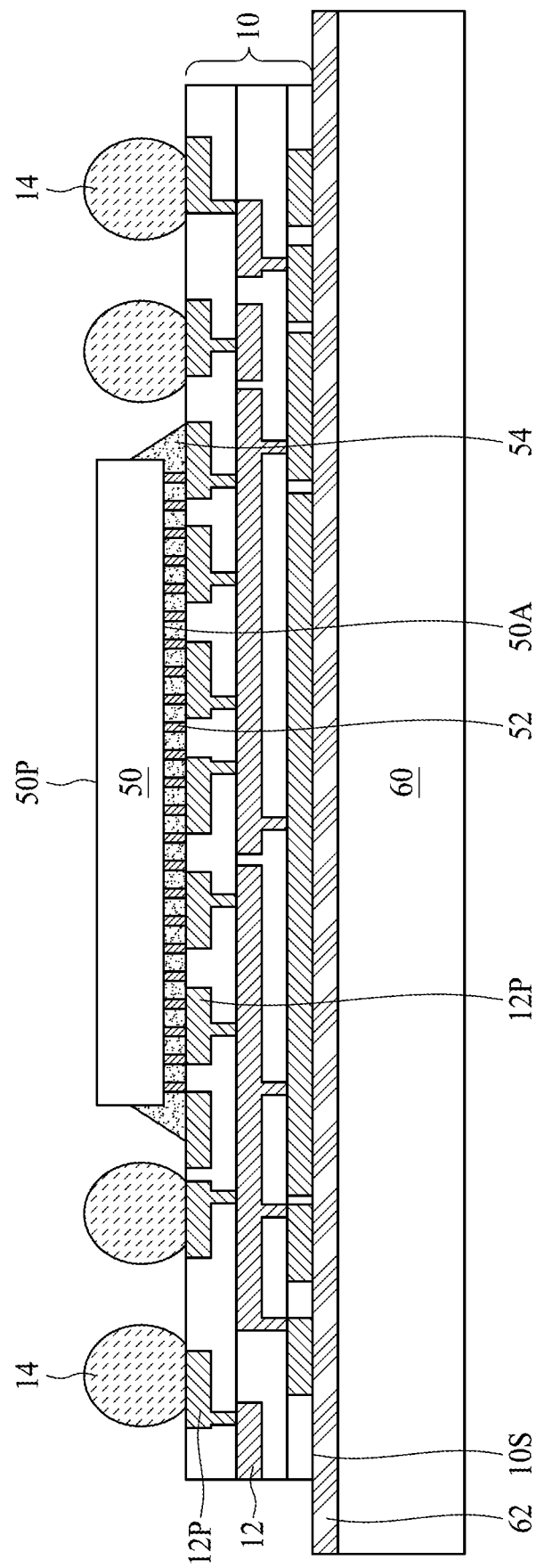

As shown in FIG. 3C, at least one semiconductor die 50 is disposed on the first conductive structure 10. In some embodiments, the semiconductor die 50 may be bonded to the first conductive structure 10 in a flip chip manner. Conductive features 52 such as copper pillars, solder pastes or a combination thereof can be used to electrically connect the semiconductor die 50 to the first conductive structure 10. In some embodiments, an underfill (UF) 54 may be formed between the semiconductor die 50 and the first conductive structure 10.

Figure 3D:
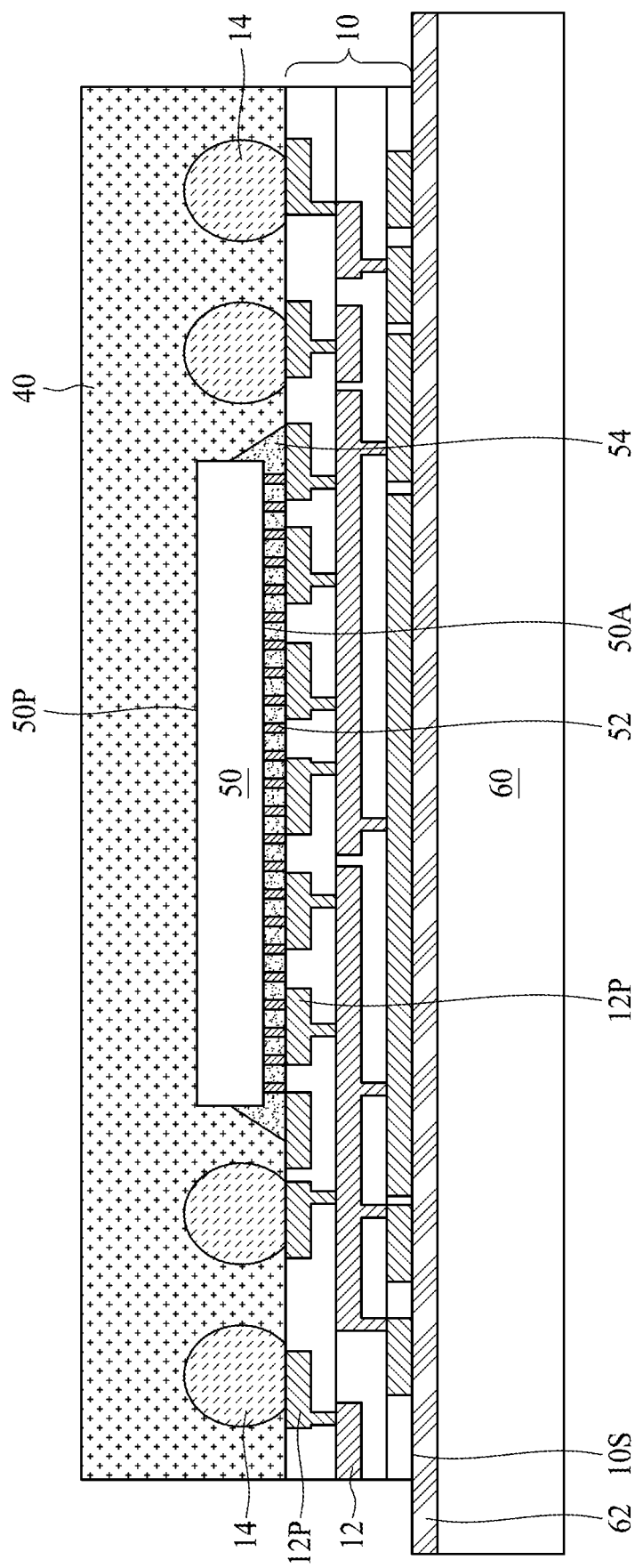

As shown in FIG. 3D, an encapsulant 40 is formed on the first conductive structure 10 and covers the connection element 14 and the semiconductor die 50. In some embodiments, the underfill 54 may be omitted, and the encapsulant 40 may be further filled between the semiconductor die 50 and the first conductive structure 10 and served as molding underfill (MUF).

Figure 3E:
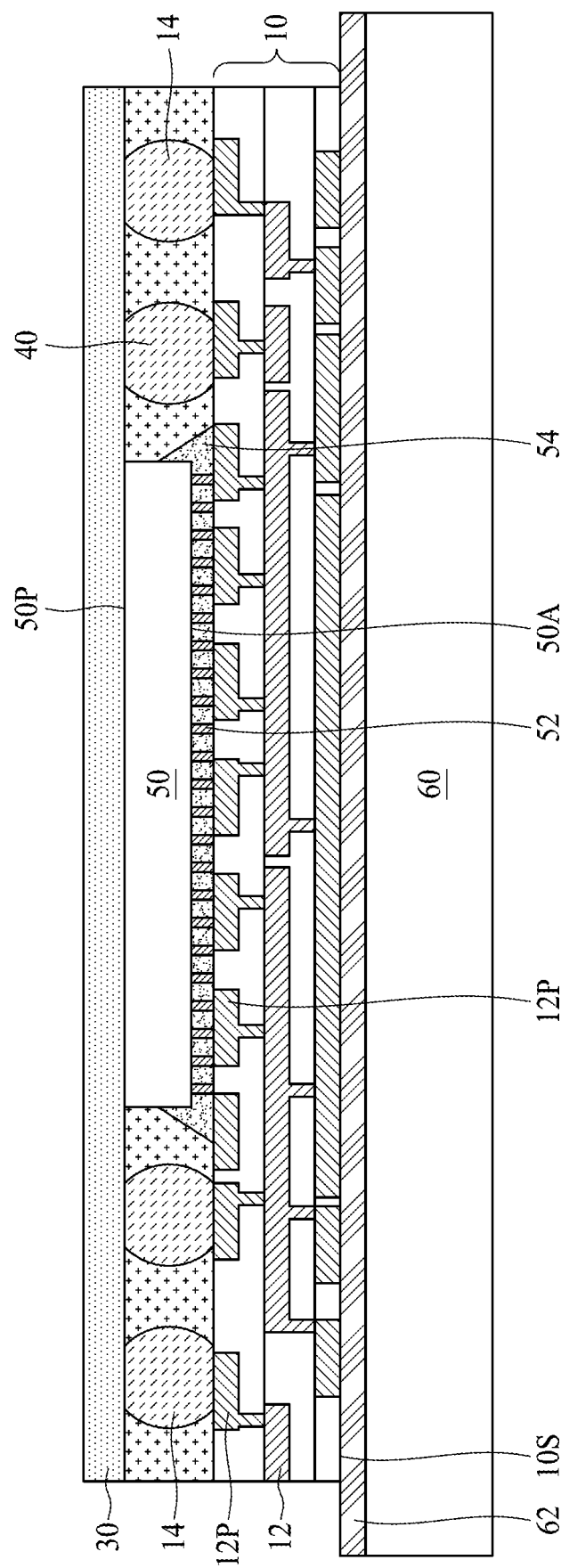

As shown in FIG. 3E, the encapsulant 40 and the connection element 14 are truncated by e.g., a grinding operation. In some embodiments, the encapsulant 40 is grinded to expose inactive surface 50P of the semiconductor die 50. Accordingly, the inactive surface 50P of the semiconductor die 50 is substantially coplanar with an upper surface 40U of the encapsulant 40 and an upper surface 14U of the connection element 14 after being truncated. A binding layer 30 is then formed on the encapsulant 40, the semiconductor die 50 and the connection element 14. In some embodiments, the binding layer 30 may include a non-conductive film (NCF), and the NCF may be laminated on the encapsulant 40. In some other embodiments, the binding layer 30 may include a non-conductive paste (NCP), and the NCP may be coated on the encapsulant 40.

Figure 3F:
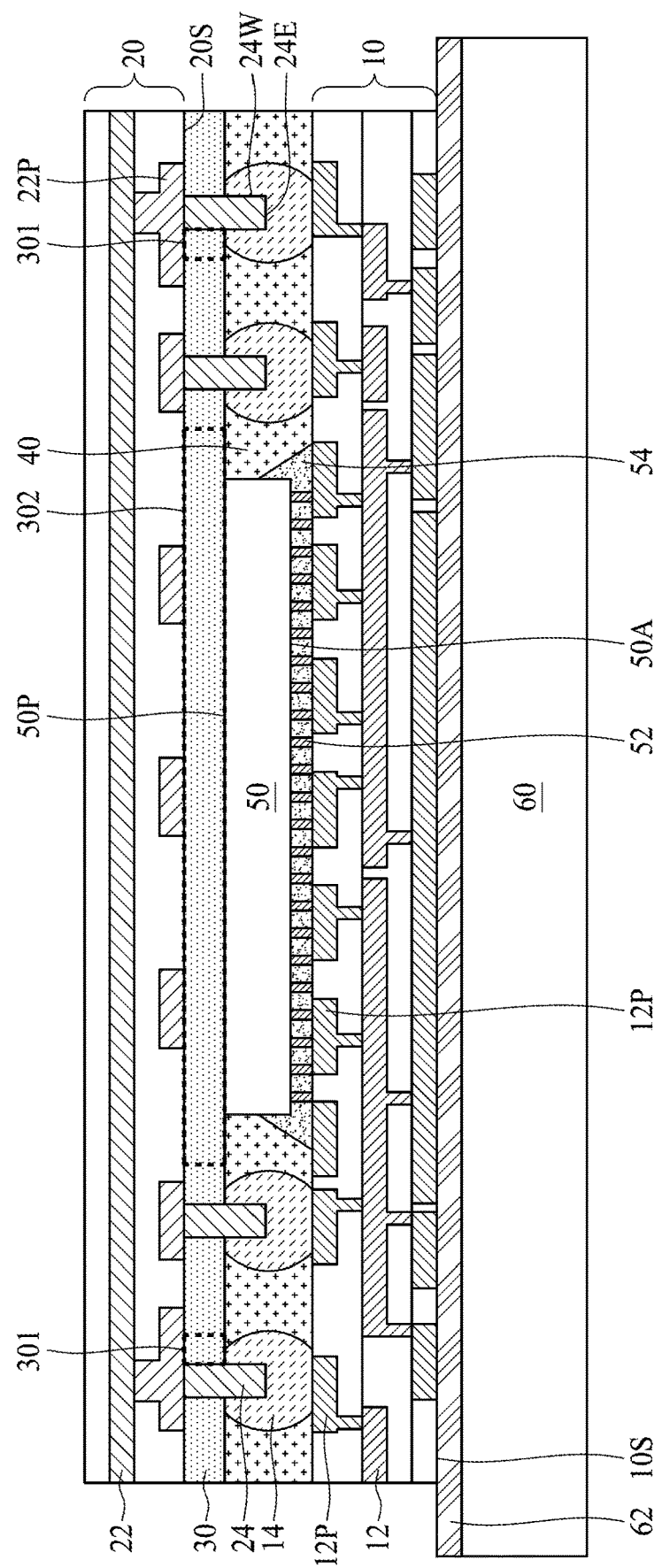

As shown in FIG. 3F, a second conductive structure 20 is disposed on the encapsulant 40, the connection element 14 and the semiconductor die 50. The second conductive structure 20 is then bonded to the first conductive structure 10 with the binding layer being interposed between the second conductive structure 20 and the encapsulant 40 and with the conductive member 24 penetrating through the binding layer 30. In some embodiments, the second conductive structure 20 is bonded to the first conductive structure 10 by thermal compression bonding by applying heat and pressure on the second conductive structure 20. In some embodiments, the conductive member 24 thus may perforate the binding layer 30 and insert into the connection element 14 as shown in FIG. 1B. In some other embodiments, intermetallic compound (IMC) of the materials of the connection element 14 and the conductive member 24 such as Cu—Sn IMC may be generated, thereby forming an interfacial layer 26 as shown in FIG. 2A. In some other embodiments, the binding layer 30 may be stretched during the thermal compression, and forms an extending portion 30E extending between the sidewall 24W of the conductive member 24 and the connection element 14 as shown in FIG. 2B. In some cases, residues of the binding layer 30 may be entrapped between the end 24E of the conductive member 24 and the connection element 14, or in the interfacial layer 26.

Subsequently, the carrier 60 is removed, and the seed layer 62 is removed by e.g., etching to expose the back side 10S of the first conductive structure 10. Electrical conductors 16 such as solder balls are formed on a back side 10S of the first conductive structure 10 to form the semiconductor device packages 1, 2A or 2B as illustrated in FIG. 1, FIG. 2A or FIG. 2B.

In the above embodiments, the binding layer 30 is formed prior to the second conductive structure 20 is disposed on the encapsulant 40, the semiconductor die 50 and the connection element 14.

Figure 4A:
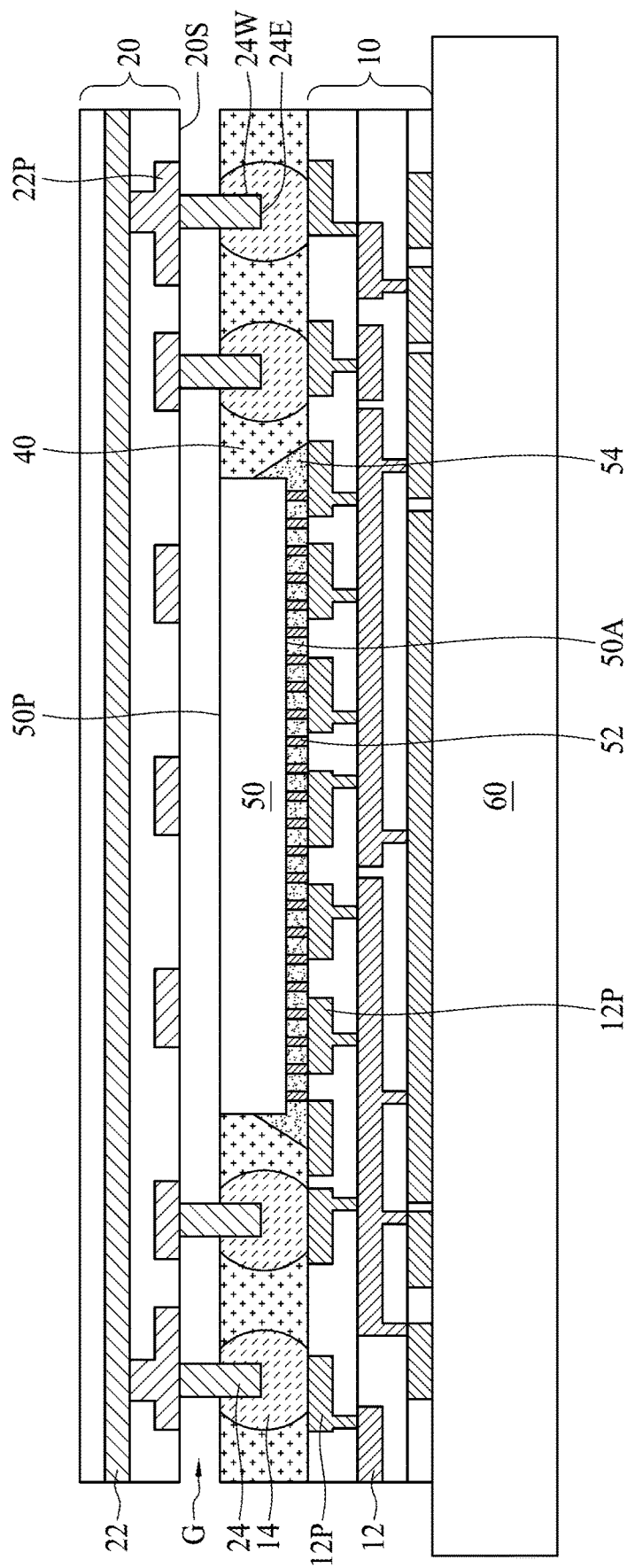
FIG. 4A and FIG. 4B illustrate operations of manufacturing a semiconductor device package in accordance with some other embodiments of the present disclosure.
Figure 4B:
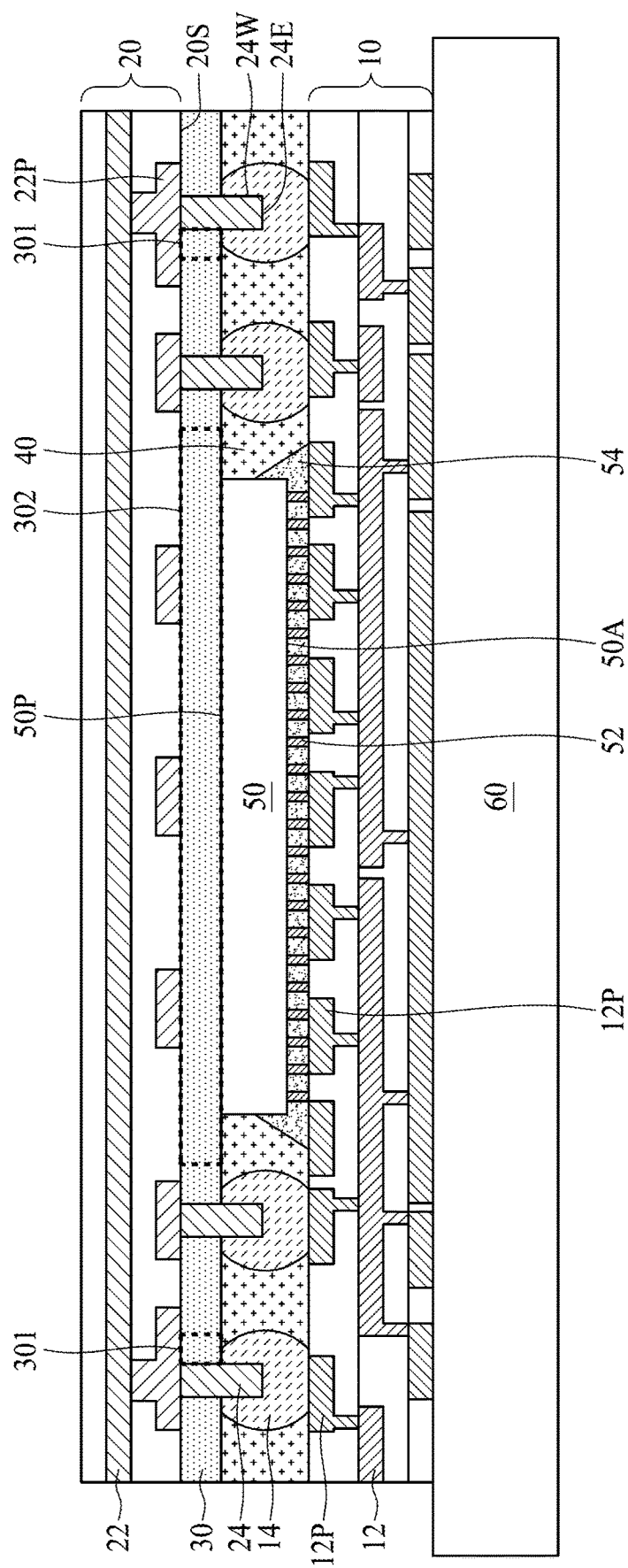

FIG. 4A and FIG. 4B illustrate operations of manufacturing a semiconductor device package in accordance with some other embodiments of the present disclosure. The manufacturing operation illustrated in FIG. 4A and FIG. 4B may be performed subsequent to the manufacturing operation illustrated in FIG. 3D. As shown FIG. 4A, the encapsulant 40 is truncated. The second conductive structure 20 is disposed on the encapsulant 40, the semiconductor die 50 and the connection element 14. The second conductive structure 20 is then bonded to the first conductive structure 10 by e.g., thermal compression bonding with the conductive member 24 inserting into the connection element 14, and a gap G may exist between the encapsulant 40 and the second conductive structure 20.

As shown in FIG. 4B, the binding layer 30 is formed subsequent to the second conductive structure 20 is disposed on the encapsulant 40, the semiconductor die 50 and the connection element 14. In some embodiments, the binding layer 30 may include an underfill (UF), and the UF may be filled in the gap G between the encapsulant 40 and the second conductive structure 20 by capillary effect.

In some embodiments of the present disclosure, a semiconductor device package includes a binding layer interposed between two stacking conductive structures. The binding layer is in contact with all the upper surface of an encapsulant of the underlying conductive structure, and thus provides sufficient stress upon the encapsulant 40 to compensate for the deformation of the underlying conductive structure. Accordingly, warpage of the semiconductor device package can be alleviated. Furthermore, the encapsulant of the underlying conductive structure is truncated prior to the overlying conductive structure and the binding layer are formed. The truncated encapsulant not only has thin thickness, but also provides a uniform upper surface for bonding the binding layer and the overlying conductive structure. Accordingly, the overall thickness of the semiconductor device package can be reduced and the reliability and yield can be improved.

In the description of some embodiments, a component provided or disposed "on" or "over" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

As used herein, the terms "approximately," "substantially," "substantial," "around" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
a first conductive structure including a first circuit layer;
a second conductive structure disposed over the first conductive structure;
a connection element disposed on and electrically connected to the first circuit layer;
an interlayer disposed between the second conductive structure and first conductive structure;
a conductive member protruding from the second conductive structure; and
an intermetallic compound layer between the conductive member and the connection element;
wherein the interlayer has an extending portion attached to the conductive member, and wherein the extending portion of the interlayer and the conductive member at least partially insert into the connection element, the extending portion of the interlayer is located between the conductive member and the connection element, the extending portion of the interlayer has an outer sidewall in contact with the connection element, the extending portion of the interlayer has an inner sidewall in contact with the conductive member, the extending portion of the interlayer accommodates the conductive member, the extending portion of the interlayer has an opening exposing the conductive member, and the conductive member electrically connects the connection element through the opening, and the intermetallic compound layer has an end adjacent to the extending portion of the interlayer.

2. The semiconductor device package of claim 1, wherein the conductive member comprises a portion protrudes beyond the extending portion of the interlayer along a direction toward the second conductive structure.

3. The semiconductor device package of claim 2, wherein the portion comprises a curved surface.

4. The semiconductor device package of claim 3, wherein a length of the conductive member is greater than a thickness of the interlayer.

5. The semiconductor device package of claim 1, wherein the end of the intermetallic compound layer is connected to an end of the extending portion of the interlayer.

6. The semiconductor device package of claim 1, further comprising an encapsulant encapsulating the extending portion of the interlayer.

7. The semiconductor device package of claim 6, wherein the encapsulant encapsulates the connection element, and exposes a top surface of the connection element.

8. The semiconductor device package of claim 7, wherein a width of the top surface of the connection element is greater than a width of the conductive member.

9. A semiconductor device package, comprising:
a first conductive structure including a first circuit layer;
a connection element disposed on and electrically connected to the first circuit layer;
an encapsulation layer encapsulating the connection element and exposing a top surface of the connection element;
a second conductive structure disposed over the encapsulation layer;
a conductive member protruding from the second conductive structure and inserting into the connection element from the top surface of the connection element; and
an interlayer disposed between the encapsulation layer and the second conductive structure,
wherein a width of the top surface of the connection element is greater than a width of the conductive member, the interlayer includes an extending portion attached to the conductive member, and wherein both the extending portion of the interlayer and the conductive member extend into the connection element, the interlayer is in contact with the top surface of the connection element, the extending portion of the interlayer has an opening exposing the conductive member, and the conductive member electrically connects the connection element through the opening, and the conductive member protrudes beyond the extending portion of the interlayer along a direction toward the second conductive structure.

\* \* \* \* \*